US012690502B2

(12) United States Patent
Lee et al.

(10) Patent No.: US 12,690,502 B2
(45) Date of Patent: Jul. 21, 2026

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Jeonghyun Lee, Suwon-si (KR); Jiyong Park, Suwon-si (KR); Jinwoo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 582 days.

(21) Appl. No.: 18/180,563

(22) Filed: Mar. 8, 2023

(65) Prior Publication Data

US 2024/0063106 A1    Feb. 22, 2024

(30) Foreign Application Priority Data

Aug. 19, 2022    (KR) ......................... 10-2022-0103766

(51) Int. Cl.
| | |
|---|---|
| *H10W 90/00* | (2026.01) |
| *H10B 80/00* | (2023.01) |
| *H10W 70/68* | (2026.01) |
| *H10W 74/01* | (2026.01) |
| *H10W 99/00* | (2026.01) |
| *H10W 72/00* | (2026.01) |

(Continued)

(52) U.S. Cl.
CPC .......... *H10W 90/401* (2026.01); *H10B 80/00* (2023.02); *H10W 70/68* (2026.01); *H10W 72/07232* (2026.01); *H10W 74/01* (2026.01); *H10W 99/00* (2026.01); *H10W 72/072*

(2026.01); *H10W 72/073* (2026.01); *H10W 72/354* (2026.01); *H10W 74/15* (2026.01); *H10W 90/701* (2026.01); *H10W 90/724* (2026.01); *H10W 90/734* (2026.01)

(58) Field of Classification Search
None
See application file for complete search history.

(56) References Cited

U.S. PATENT DOCUMENTS 9,905,491 B1    2/2018 Yoon et al.
10,431,536 B2   10/2019 Kim et al.
(Continued)

FOREIGN PATENT DOCUMENTS

KR    10-2012-0073133 A    7/2012
KR      101653563 B1    9/2016
(Continued)

*Primary Examiner* — Nicholas J Tobergte
(74) *Attorney, Agent, or Firm* — Wolf, Greenfield & Sacks, P.C.

(57)    ABSTRACT

A semiconductor package includes a package substrate, a first semiconductor device on the package substrate, an interposer on the package substrate, and a plurality of conductive structures that spaces apart the first semiconductor device from the interposer, wherein the interposer has a cavity into which a portion of the first semiconductor device is accommodated. The interposer has a plurality of spacers protruding from a bottom surface of the cavity of the interposer. The cavity has an inclined sidewall inclined at a predetermined angle with respect to the lower surface of the interposer. The spacer has an inclined side surface inclined at a predetermined angle with respect to the bottom surface of the cavity.

20 Claims, 14 Drawing Sheets

(51) Int. Cl.
    *H10W 72/30*      (2026.01)
    *H10W 74/15*      (2026.01)

(56)            References Cited

U.S. PATENT DOCUMENTS

| | | | | |
|---|---|---|---|---|
| 11,075,183 | B2 | 7/2021 | Lee et al. | |
| 2006/0065972 | A1* | 3/2006 | Khan | H01L 23/13 |
| | | | | 257/E23.079 |
| 2013/0207261 | A1* | 8/2013 | Thacker | H01L 24/90 |
| | | | | 257/738 |
| 2019/0131284 | A1* | 5/2019 | Jeng | H01L 24/27 |
| 2022/0115281 | A1 | 4/2022 | Kim et al. | |
| 2022/0359439 | A1 | 11/2022 | Lee et al. | |
| 2022/0406753 | A1* | 12/2022 | Cheah | H01L 23/5386 |

FOREIGN PATENT DOCUMENTS

| | | |
|---|---|---|
| KR | 10-2022-0039385 A | 3/2022 |
| KR | 20220037713 A | 3/2022 |
| KR | 20220151312 A | 11/2022 |

* cited by examiner

F I G .   2

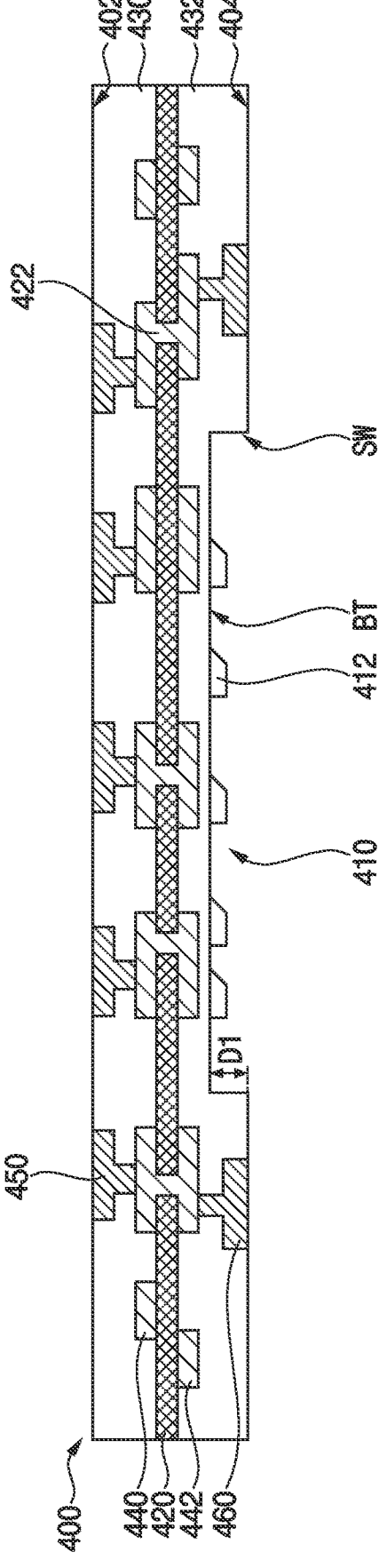
F I G. 4

Figure 6:
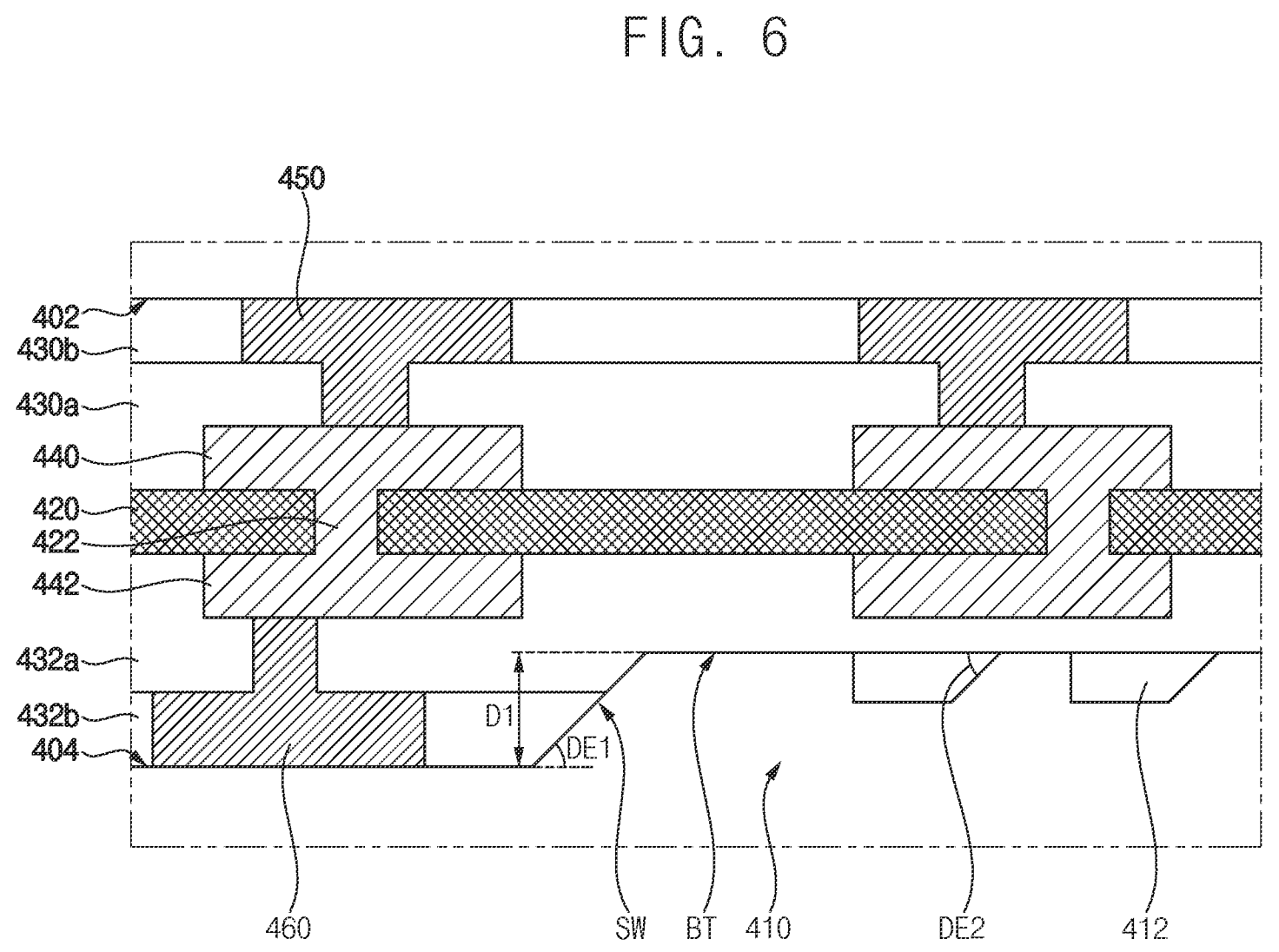

Figure 7:
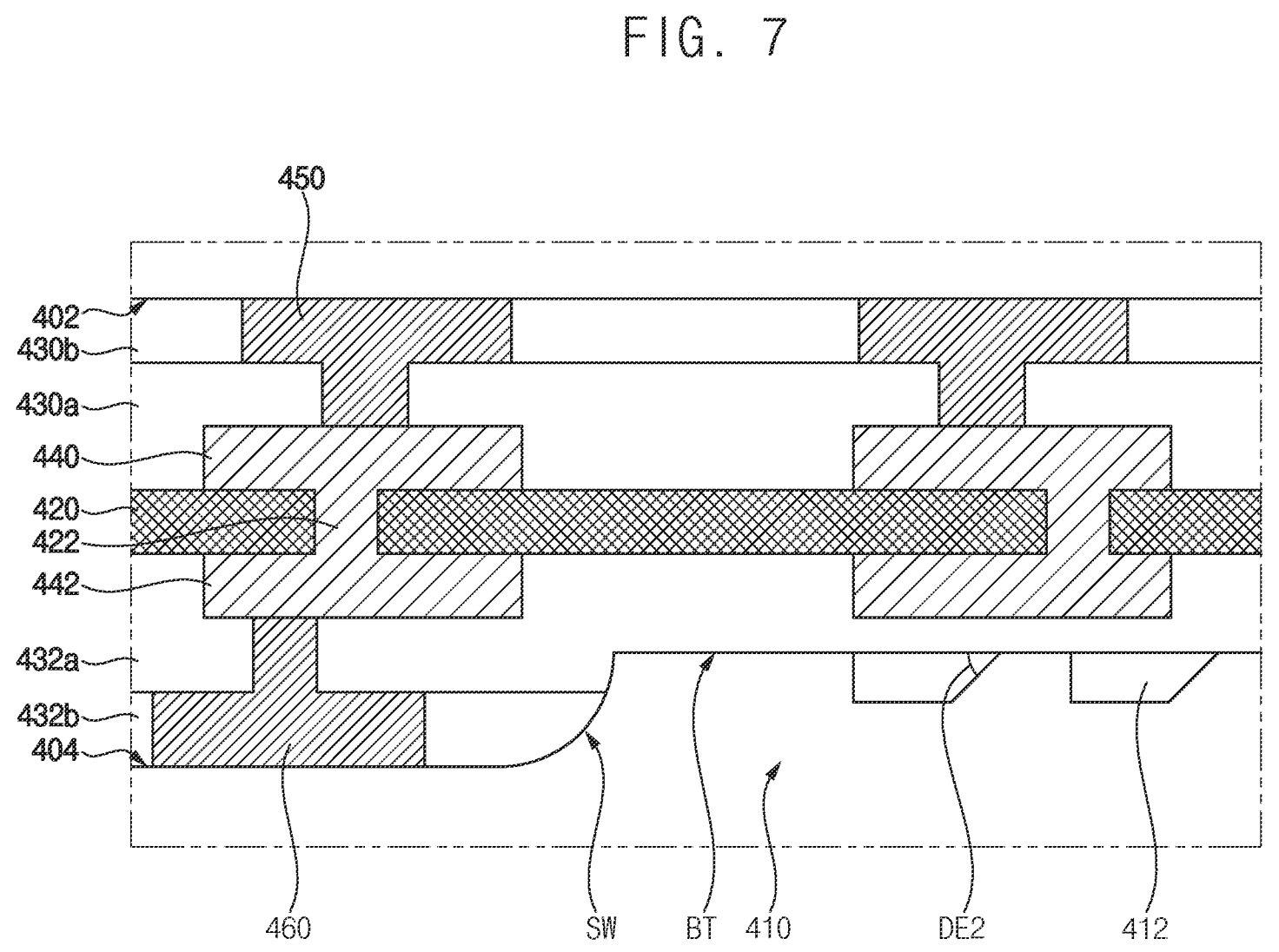

Figure 11:
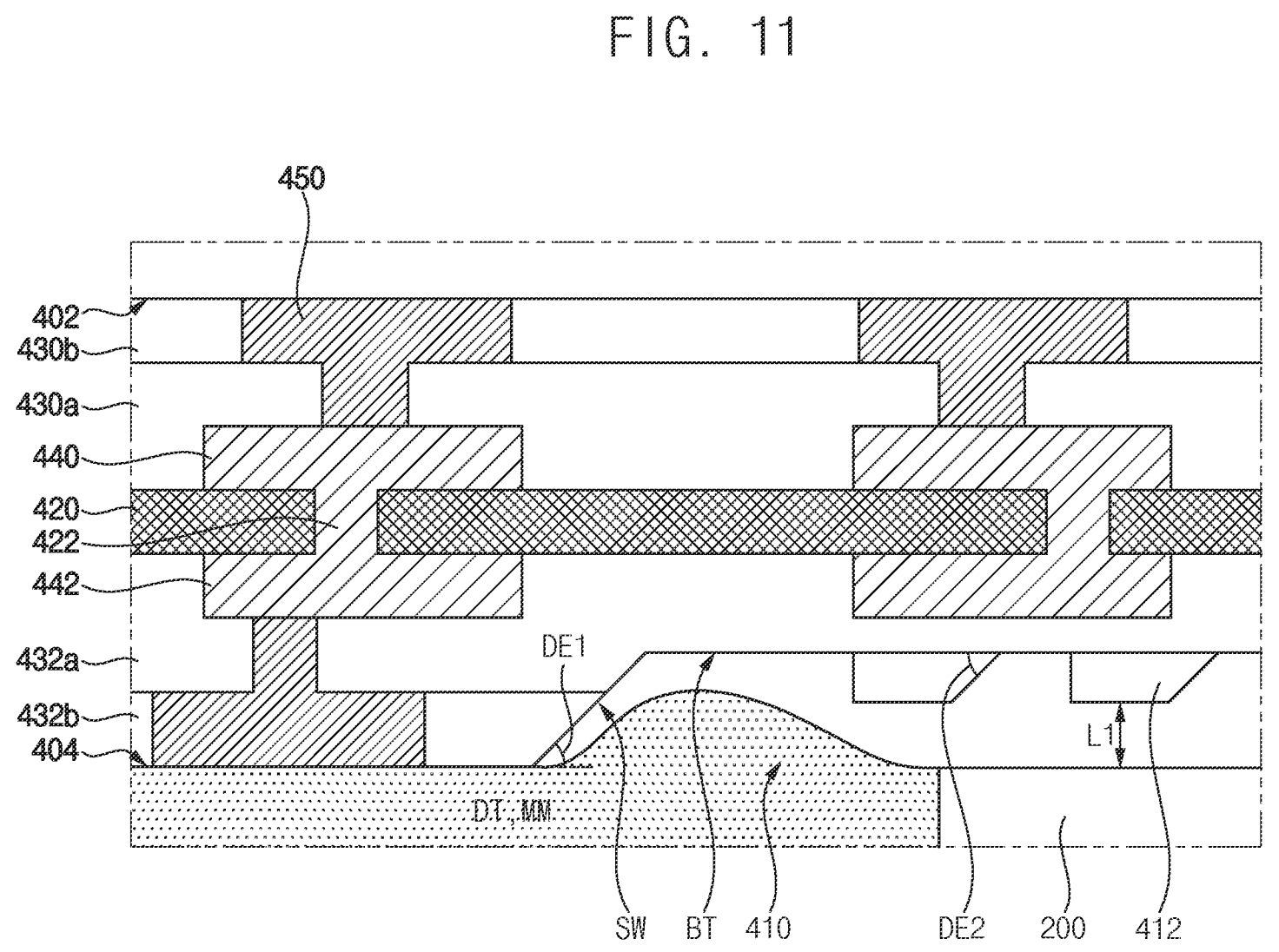

Figure 12:
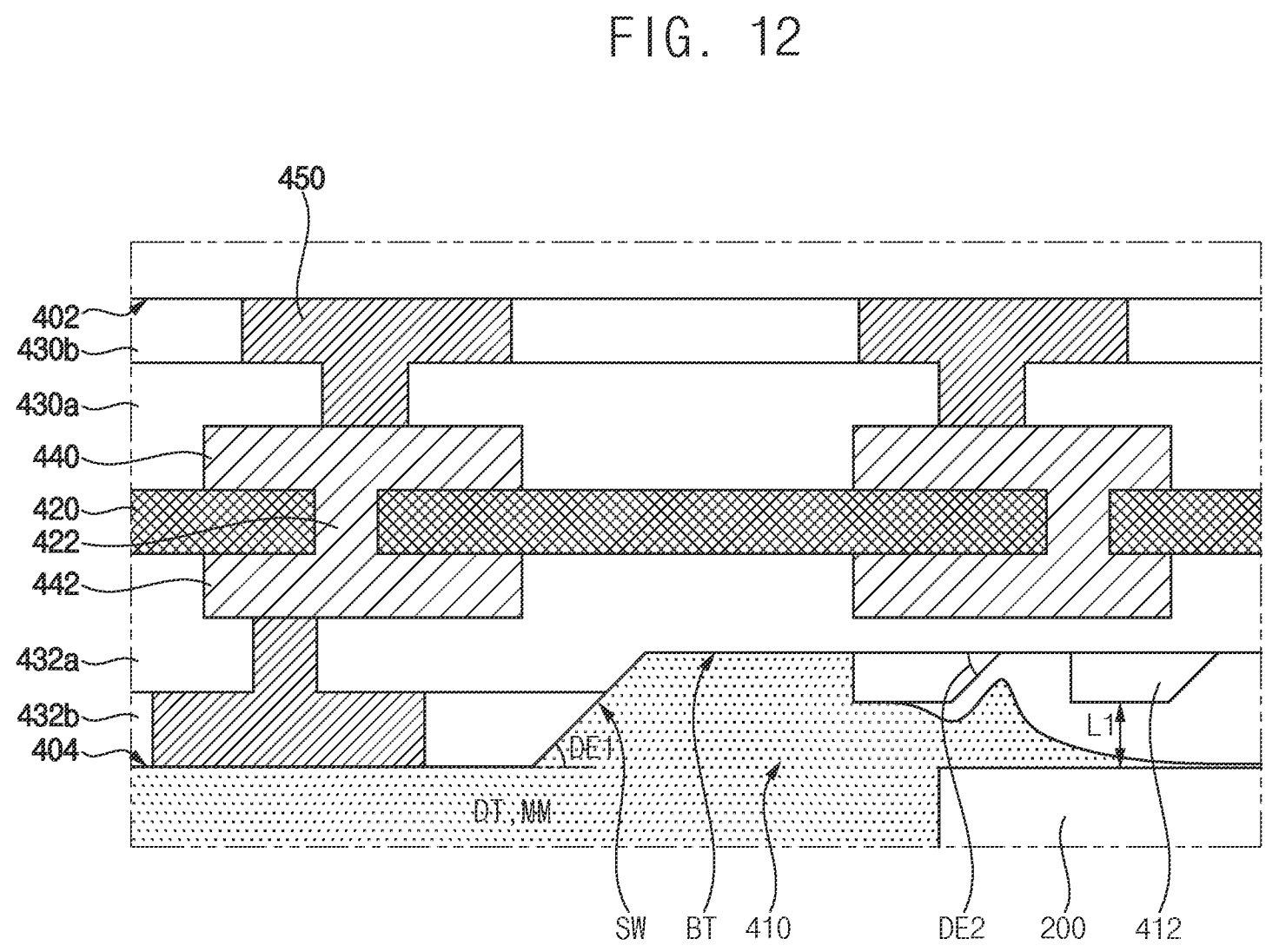

SEMICONDUCTOR PACKAGE AND METHOD OF MANUFACTURING THE SAME

CROSS-REFERENCE TO RELATED APPLICATION

This application claims priority and benefit of Korean Patent Application No. 10-2022-0103766, filed on Aug. 19, 2022 with the Korean Intellectual Property Office (KIPO), the disclosures and inventive concepts of which are herein incorporated by reference in their entirety.

BACKGROUND

Example embodiments relate to a semiconductor package and a method of manufacturing the same. More particularly, example embodiments relate to a semiconductor package including a plurality of stacked different semiconductor devices and a method of manufacturing the same.

In a package-on-package technology, a package structure for increasing a thickness of a semiconductor chip while reducing a size of a semiconductor package may be required to improve semiconductor performance. In order to reduce the size of the semiconductor package, a method of forming a cavity under the interposer and accommodating the semiconductor chip into the formed inner space of cavity may be used. An edge portion of the formed cavity may disturb a flow of fluids such as cleaning agent and molding member (EMC) in a cleaning process, a molding process, and the like, and may cause voids.

SUMMARY

Example embodiments may provide a semiconductor package including an interposer having a semiconductor chip accommodating space that does not disturb a flow of fluid.

Example embodiments may provide a method of manufacturing the semiconductor package.

According to example embodiments, a semiconductor package comprises a package substrate; a first semiconductor device on the package substrate; an interposer on the package substrate; a plurality of conductive structures that spaces apart the first semiconductor device from the interposer, wherein the interposer has a cavity into which a portion of the first semiconductor device is accommodated; and a spacer that protrudes from a bottom surface of the cavity, wherein the cavity has an inclined sidewall inclined at a first predetermined angle with respect to a lower surface of the interposer, and the spacer has an inclined side surface inclined at a second predetermined angle with respect to the bottom surface of the cavity.

According to example embodiments, a semiconductor package comprises: a package substrate; a semiconductor device on the package substrate; a plurality of conductive structures on the package substrate, wherein the plurality of conductive structures is in an outer region of the semiconductor device; and an interposer on the conductive structures, wherein the interposer includes a cavity that has an inclined sidewall inclined at a first predetermined angle with respect to a lower surface of the interposer, wherein the cavity is configured to define a space in which the semiconductor device is accommodated, wherein the interposer includes a spacer that protrudes from a bottom surface of the cavity, and wherein the spacer has an inclined side surface inclined at a second predetermined angle with respect to the bottom surface of the cavity.

According to example embodiments, a method of manufacturing a semiconductor package, comprising: mounting a semiconductor device on a package substrate; forming an interposer having a cavity extending from a first surface of the interposer by a predetermined depth; forming a spacer on a bottom surface of the cavity; processing a sidewall of the cavity and a side surface of the spacer to have predetermined angles; disposing the interposer on the package substrate via a plurality of conductive structures such that a portion of the semiconductor device is accommodated into the cavity; and forming a molding member between the package substrate and the interposer.

Thus, since the first semiconductor device is accommodated in the cavity, a size of the semiconductor package may be reduced. A cleaning agent may move between the package substrate and the interposer in a cleaning process, and a molding member may be filled between the package substrate and the interposer in a molding process. Since the cavity has the sidewall inclined at the predetermined angle and the spacer has the side surface inclined at the predetermined angle, a flow of fluid such as the cleaning agent and the molding member moving between the package substrate and the interposer may not be disturbed. Since the cavity does not disturb the flow of the fluid, a phenomenon in which voids are generated inside the semiconductor package may be prevented.

BRIEF DESCRIPTION OF THE DRAWINGS

Example embodiments will be more clearly understood from the following detailed description taken in conjunction with the accompanying drawings. FIGS. 1 to 14 represent non-limiting, example embodiments as described herein.

FIG. 1 is a cross-sectional view illustrating a semiconductor package in accordance with example embodiments.

FIG. 2 is an enlarged cross-sectional view illustrating portion 'A' in FIG. 1.

FIGS. 3 to 14 are cross-sectional views illustrating a method of manufacturing a semiconductor package in accordance with example embodiments.

DETAILED DESCRIPTION OF EXAMPLE EMBODIMENTS

Hereinafter, example embodiments will be explained in detail with reference to the accompanying drawings.

Figure 1:
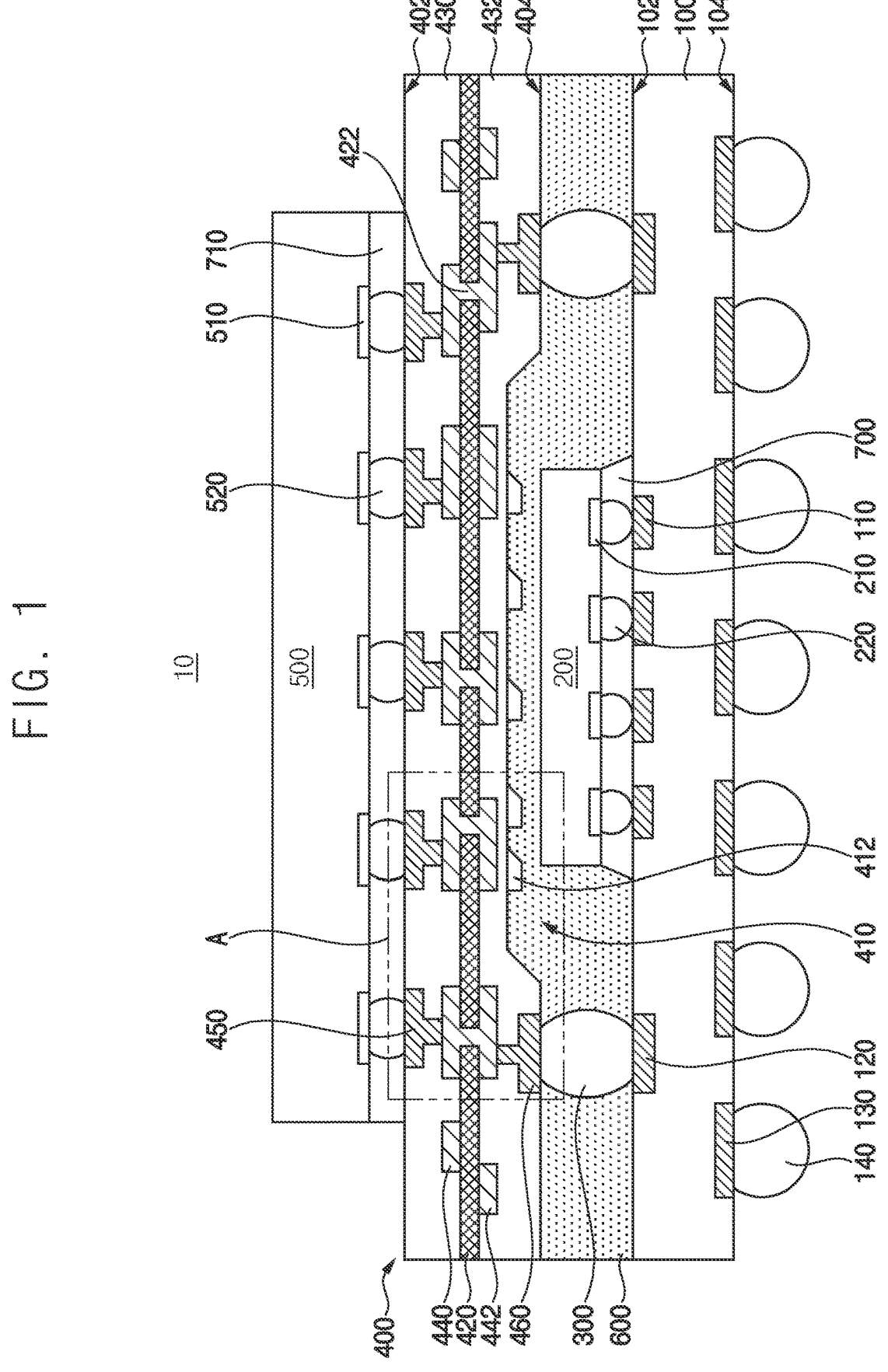
Figure 2:
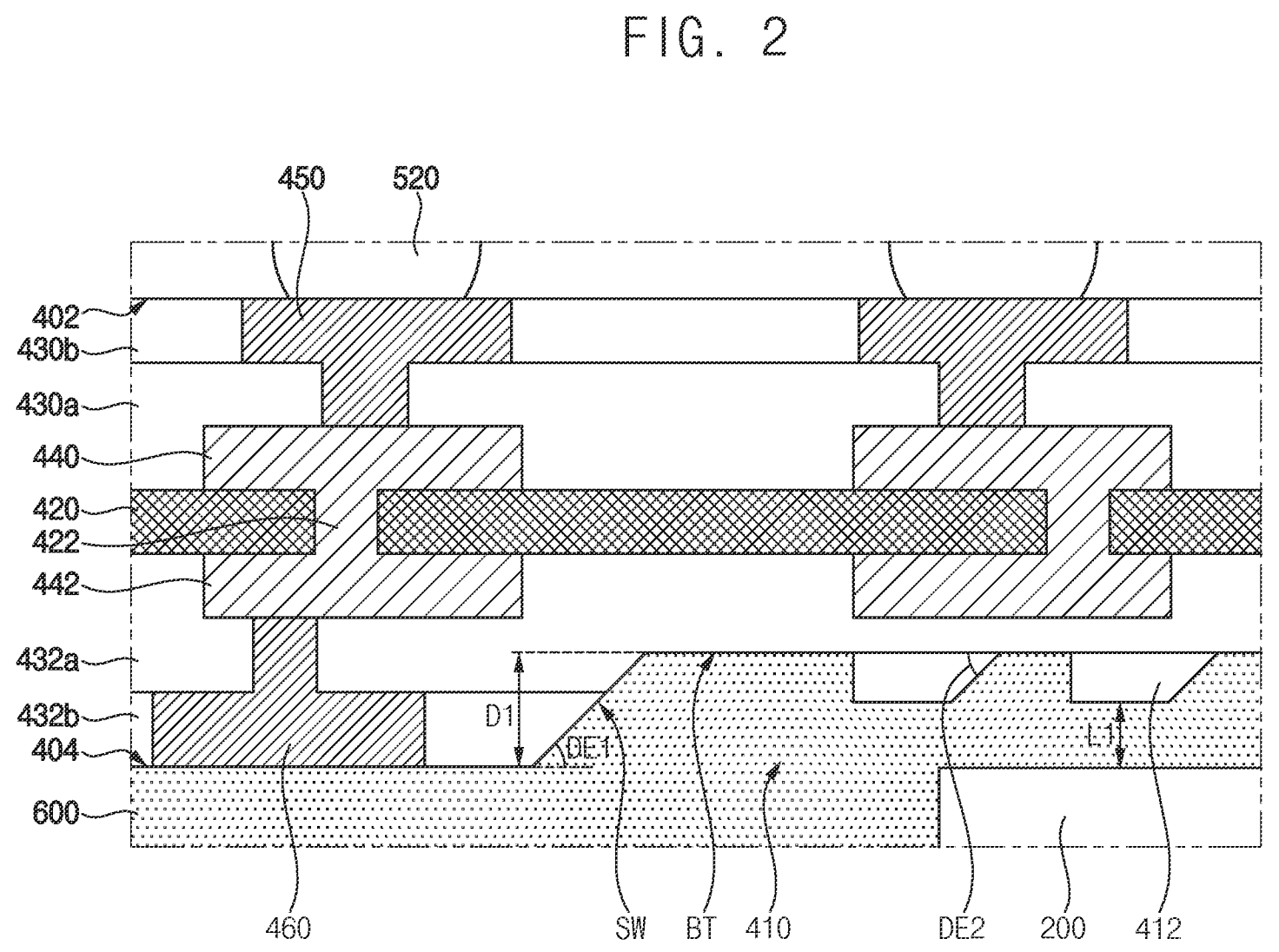

FIG. 1 is a cross-sectional view illustrating a semiconductor package in accordance with example embodiments. FIG. 2 is an enlarged cross-sectional view illustrating portion 'A' in FIG. 1.

Referring to FIGS. 1 and 2, a semiconductor package 10 may include a package substrate 100, a first semiconductor device 200 disposed on the package substrate 100, an interposer 400, and a plurality of conductive structures 300 electrically connecting the package substrate 100 and the interposer 400. The semiconductor package 10 may further include second semiconductor device 500 disposed on the interposer 400, and a molding member 600 filling between the interposer 400 and the package substrate 100.

In example embodiments, the semiconductor package 10 may be a semiconductor module having a Package on Package (POP) structure in which a plurality of semiconductor devices is stacked. The semiconductor package 10 may have an interposer package on package (IPOP) structure including the interposer 400. For example, the first semiconductor device 200 may include a logic semiconductor device, and the second semiconductor device 500 may include a memory semiconductor device. The logic semiconductor device may be an ASIC as a host such as a CPU, GPU, or SoC. The memory semiconductor device may include a high bandwidth memory (HBM) device, a dynamic random access memory (DRAM), and the like. However, the embodiments of the logic semiconductor device and the memory semiconductor device are not limited thereto.

In example embodiments, the package substrate 100 may include a first surface 102 and a second surface 104 opposite to each other. The package substrate 100 may include a plurality of first and second substrate pads 110 and 120 exposed from the first surface 102, and may include a plurality of third substrate pads 130 exposed from the second surface 104.

For example, the package substrate 100 may include a printed circuit board (PCB). The printed circuit board may be a multilayer circuit board having vias and various circuits therein. The first to third substrate pads 110, 120, and 130 may be electrically connected to each other through the circuits (and vias) inside the package substrate 100. The package substrate 100 may provide high-density interconnection between the first and second semiconductor devices 200 and 500 through the circuits (and vias).

The first semiconductor device 200 may include a plurality of first conductive bumps 220 respectively provided on a plurality of first chip pads 210 on a lower surface thereof. The first semiconductor device 200 may be mounted on the package substrate 100 via the first conductive bumps 220 and may be electrically connected to the package substrate 100. The first conductive bumps 220 of the first semiconductor device 200 may be in contact with and/or electrically connected to the first substrate pads 110 of the package substrate 100. For example, the first conductive bumps 220 may include micro bumps (uBumps).

The package substrate 100 may further include external connection bumps 140 to electrically connect with other (external) semiconductor devices. The external connection bumps 140 may be respectively provided on the third substrate pads 130. For example, the external connection bump 140 may include a C4 bump.

In example embodiments, the conductive structures 300 may be provided between the package substrate 100 and the interposer 400 to electrically connect the package substrate 100 and the interposer 400. The conductive structures 300 may be respectively provided on the second substrate pads 120 of the package substrate 100. The conductive structures 300 may be electrically connected to the first semiconductor device 200 through the package substrate 100. The conductive structure 300 may provide a signal movement path to electrically connect the first and second semiconductor devices 200 and 500.

For example, the conductive structure 300 may include a bump shape or a pillar shape, but not limited thereto. The conductive structure 300 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn), but not limited thereto.

In example embodiments, the interposer 400 may have an upper surface 402 and a lower surface 404 opposite to each other. The interposer 400 may be disposed on the first surface 102 of the package substrate 100 via the conductive structures 300. The interposer 400 may include a cavity 410 configured to define a space in which a portion of the first semiconductor device 200 is accommodated, and may include a spacer (a plurality of spacers) 412 protruding from the lower surface 404 of the interposer 400.

The interposer 400 may include a core layer 420, a conductive through via 422, an upper conductive pattern 440, an upper insulating layer 430, a lower conductive pattern 442, and a lower insulating layer 432. The interposer 400 may include a plurality of first bonding pads 450 provided to be exposed on the upper surface 402 of the interposer 400, and may include a plurality of second bonding pads 460 provided to be exposed on the lower surface 404 of the interposer 400.

The core layer 420 may include a non-conductive material layer. The core layer 420 may include a reinforced polymer or the like, but not limited thereto. The core layer 420 may serve as a boundary dividing an upper portion (e.g., upper insulating layer 430 and upper conductive pattern 440) and a lower portion (e.g., lower insulating layer 432 and lower conductive pattern 442) of the interposer 400. The conductive through via 422 may penetrate through the core layer 420, and electrically connect the upper conductive pattern 440 and the lower conductive pattern 442.

The upper insulating layer 430 may include first and second upper insulating layers 430a and 430b. The upper conductive pattern 440 may be provided in the upper insulating layer 430.

In particular, the upper conductive pattern 440 may be provided in the first upper insulating layer 430a. A lower surface of the upper conductive pattern 440 may be exposed from the first upper insulating layer 430a. For example, the lower surface of the upper conductive pattern 440 may not be in contact with the first upper insulating layer 430a. The upper conductive pattern 440 may extend in an extending direction of the core layer 420 in the first upper insulating layer 430a. The lower surface of the upper conductive pattern 440 may contact the core layer 420.

The first upper insulating layer 430a may have a first opening that exposes (a portion of) an upper surface of the upper conductive pattern 440. The first bonding pad 450 may be formed on the first upper insulating layer 430a and may contact the upper conductive pattern 440 through the first opening. The second upper insulating layer 430b may be formed on the first upper insulating layer 430a and may have a second opening that exposes the first bonding pad 450. Accordingly, the plurality of first bonding pads 450 may be exposed from an upper surface of the second upper insulating layer 430b.

The second bonding pads 460 may be respectively bonded to the conductive structures 300. The second bonding pads 460 may be electrically connected to the second substrate pads 120 of the package substrate 100 through the conductive structures 300.

The lower insulating layer 432 may include first and second lower insulating layers 432a and 432b. The lower conductive pattern 442 may be provided in the lower insulating layer 432.

In particular, the lower conductive pattern 442 may be provided in the first lower insulating layer 432a. An upper surface of the lower conductive pattern 442 may be exposed from the first lower insulating layer 432a. For example, the upper surface of the lower conductive pattern 442 may not be in contact with the first lower insulating layer 432a. The lower conductive pattern 442 may extend in the extending direction of the core layer 420 in the first lower insulating layer 432a. The upper surface of the lower conductive pattern 442 may contact the core layer 420.

The first lower insulating layer 432a may have a third opening that exposes (a portion of) lower surfaces of the lower conductive patterns 442. The second bonding pad 460 may be formed on the first lower insulating layer 432a and may contact the lower conductive pattern 442 through the third opening.

The first lower insulating layer 432a may have a first opening region for defining the cavity 410. The second bonding pad 460 and the lower conductive pattern 442 may not be provided in the first opening region. A sidewall (SW) of the cavity 410 inclined at a predetermined angle may be provided on an inner surface of the first opening region.

The second lower insulating layer 432b may be formed on the first lower insulating layer 432a and may have a fourth opening that exposes the second bonding pad 460. Accordingly, the plurality of second bonding pads 460 may be exposed from lower surfaces of the second lower insulating layer 432b.

The second lower insulating layers 432b may have a second opening region for defining the cavity 410. The second bonding pad 460 and the lower conductive pattern 442 may not be provided in the second opening region. A sidewall SW of the cavity 410 inclined at a predetermined angle may be provided on an inner surface of the second opening region.

For example, the upper conductive pattern 440, the lower conductive pattern 442, and the first and second bonding pads 450 and 460 may include aluminum (Al), copper (Cu), tin (Sn), nickel (Ni), gold (Au), platinum (Pt), or an alloy thereof, but not limited thereto. The upper and lower insulating layers 432a and 432b may include a polymer or a dielectric layer.

The second semiconductor device 500 may include a plurality of second conductive bumps 520 respectively provided on a plurality of second chip pads 510 on a lower surface of the second semiconductor device 500. The second semiconductor device 500 may be mounted on the interposer 400 via the second conductive bumps 520 and electrically connected to the interposer 400. The second conductive bumps 520 of the second semiconductor device 500 may be bonded to and electrically connected to the first bonding pads 450 of the interposer 400. For example, the second conductive bumps 520 may include micro bumps (uBumps).

In example embodiments, the cavity 410 may define the space in which the first semiconductor device 200 is accommodated. The cavity 410 may be provided on the lower surface 404 of the interposer 400. The cavity 410 may have a shape recessed from the lower surface 404 of the interposer 400. The cavity 410 may be defined by the first opening region of the first lower insulating layer 432a and the second opening region of the second lower insulating layer 432b. The first and second opening regions may have an opening shape penetrating the first and second lower insulating layers 432a and 432b in a thickness direction (e.g., vertical direction to the package substrate 100).

The cavity 410 may have a bottom surface (BT) and an open upper surface. The cavity 410 may have a first depth D1. The first depth D1 of the cavity 410 may be a distance between the bottom surface and the open upper surface (in a vertical direction). The first depth D1 of the cavity 410 may be within a range of 250 micrometers ($\mu$m) to 450 $\mu$m.

The cavity 410 may include the bottom surface BT and the inclined sidewall SW surrounding the bottom surface BT. The inclined sidewall SW may be a region extending from the bottom surface BT of the cavity 410 to the open upper surface. The inclined sidewall SW may be defined from inner surfaces of the first and second opening regions. The bottom surface BT may be a surface exposed from the lower surface 404 of the interposer 400.

The inclined sidewall SW may have a surface inclined from a vertical direction. The inclined sidewall SW may not disturb (less disturb) a flow of fluid moving between the package substrate 100 and the interposer 400 through an inclined surface. For example, the cavity 410 may include a tapered shape, but not limited thereto. The inclined sidewall SW of the cavity 410 may have a fillet shape or a chamfer shape, but not limited thereto.

The inclined sidewall SW may have a first angle DE1 from the lower surface 404 of the interposer 400. The flow of the fluid moving between the package substrate 100 and the interposer 400 may be controlled by the first angle DE1 of the inclined sidewall SW. For example, the first angle DE1 may be within a range of 15 degrees to 40 degrees, but not limited thereto.

In example embodiments, the plurality of spacers 412 may protrude from the bottom surface BT of the cavity 410. The plurality of spacers 412 may serve to separate the first semiconductor device 200 from the lower surface 404 of the interposer 400. The plurality of spacers 412 may prevent the first semiconductor device 200 from contacting the lower surface 404 of the interposer 400 and blocking the flow of the fluid. The plurality of spacers 412 may provide a space in which the fluid moves between the interposer 400 and the first semiconductor device 200.

The spacer 412 may include at least one side surface inclined at a predetermined angle. The inclined side surface of the spacer 412 may include a shape in which one side is inclined or both sides are inclined. The spacer 412 may not disturb (less disturb) the flow of the fluid moving between the package substrate 100 and the interposer 400 through the inclined side surface.

The inclined side surface of the spacer 412 may have a second angle DE2 from the lower surface 404 of the interposer 400. The flow of the fluid moving between the package substrate 100 and the interposer 400 may be controlled by the second angle DE2 of the spacer 412. For example, the second angle DE2 may be within a range of 15 degrees to 40 degrees, but not limited thereto.

For example, the spacer 412 may include a circular cone shape, a quadrangular pyramid shape, a hemisphere shape, a circular truncated cone shape, and a frustum of quadrangular pyramid shape, but not limited thereto.

An upper surface of the spacer 412 may be spaced apart from an upper surface of the first semiconductor device 200 by a first distance L1. For example, the upper surface of the spacer 412 may be closer than a lower surface of the spacer 412 to the package substrate 100, and a lower surface of the first semiconductor device 200 may be closer than the upper surface of the first semiconductor device 200 to the package substrate 100. When the first distance L1 is large, the spacer 412 may not disturb (less disturb) the flow of the fluid. When the first distance L1 is small, the fluid may move between the plurality of spacers 412, and the inclined side surface may prevent (reduce) the fluid from being stagnant. For example, the first distance L1 may be within a range of 15 $\mu$m to 30 $\mu$m, but not limited thereto.

The inclined sidewall SW of the cavity 410 and the inclined side surface of each of the spacers 412 may be inclined in a same direction. When the inclined sidewall SW of the cavity 410 and the inclined side surfaces of the spacers 412 are inclined in the same direction, the fluid may smoothly flow between the package substrate 100 and the interposer 400 without disturbing the flow of the fluid.

As described above, since the first semiconductor device 200 may be accommodated in the cavity 410, a size of the semiconductor package 10 may be reduced. A cleaning agent may move between the package substrate 100 and the interposer 400 in a cleaning process, and a molding member 600 may be filled between the package substrate 100 and the interposer 400 in a molding process. Since the cavity 410 has the inclined sidewall SW and the spacers 412 have the inclined side surfaces, the flow of the fluid such as the cleaning agent and the molding member 600 moving between the package substrate 100 and the interposer 400 may not be disturbed. Since the cavity 410 does not disturb the flow of the fluid, a phenomenon in which voids are generated inside the semiconductor package 10 may be prevented.

Hereinafter, a method of manufacturing the semiconductor package in FIG. 1 will be described.

FIGS. 3 to 14 are cross-sectional views illustrating a method of manufacturing a semiconductor package in accordance with example embodiments. FIGS. 6 and 7 are enlarged cross-sectional views illustrating portion 'B' in FIG. 5. FIGS. 11 and 12 are enlarged cross-sectional views illustrating portion 'C' in FIG. 10.

Referring to FIGS. 3 to 7, an interposer 400 having a cavity 410 and a plurality of spacers 412 may be formed.

Figure 3:
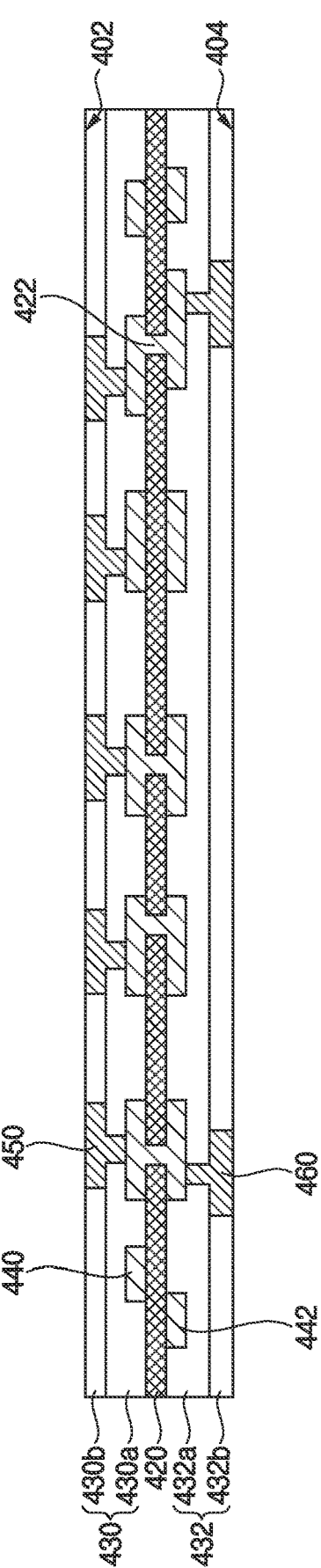

As illustrated in FIG. 3, the interposer 400 including a core layer 420, conductive through vias 422, an upper conductive pattern 440, an upper insulating layer 430, a lower conductive pattern 442, a lower insulating layer 432, and first and second bonding pads 450, 460 may be formed.

In example embodiments, the core layer 420 may include a non-conductive material layer. The core layer 420 may include a reinforced polymer or the like, but not limited thereto. The conductive through via 422 may penetrate through the core layer 420, and may electrically connect the upper conductive pattern 440 and the lower conductive pattern 442.

First, a first upper insulating layer 430a may be formed on (e.g., covering) an upper surface of the core layer 420, and a first lower insulating layer 432a may be formed on (e.g., covering) a lower surface of the core layer 420.

For example, the first upper insulating layer 430a and the first lower insulating layer 432a may include a polymer or a dielectric layer. In particular, the first upper insulating layer 430a and the first lower insulating layer 432a may include polyimide (PI), lead oxide (PbO), polyhydroxystyrene (PHS), novolac, or the like, but not limited thereto. The first upper insulating layer 430a and the first lower insulating layer 432a may be formed by a vapor deposition process, a spin coating process, or the like.

After the first upper insulating layer 430a is patterned, the upper conductive patterns 440 may be formed to directly contact the core layer 420. The upper conductive patterns 440 may be formed on the first upper insulating layer 430a by a plating process. After the first lower insulating layer 432a is patterned, the lower conductive patterns 442 may be formed to directly contact the core layer 420. The lower conductive patterns 442 may be formed on the first lower insulating layer 432a by a plating process. The plating process may include an electrolytic plating process or an electroless plating process.

Then, a second upper insulating layer 430b may be formed on the first upper insulating layer 430a. The second upper insulating layer 430b may cover (a portion of) the upper conductive patterns 440. Then, the second upper insulating layer 430b may be patterned to form first openings that expose the upper conductive patterns 440. The first bonding pads 450 may be formed on the second upper insulating layer 430b to directly contact the upper conductive patterns 440 through the first openings.

A second lower insulating layer 432b may be formed on the first lower insulating layer 432a. The second lower insulating layer 432b may cover (a portion of) the lower conductive patterns 442. Then, the second lower insulating layers 432b may be patterned to form third openings that expose the lower conductive patterns 442. The second bonding pads 460 may be formed on the second lower insulating layers 432b to directly contact the lower conductive patterns 442 through the third openings.

For example, the upper conductive pattern 440, the lower conductive pattern 442, and the first and second bonding pads 450 and 460 may include aluminum (Al), copper (Cu), tin (Sn), nickel (Ni), gold (Au), platinum (Pt), or an alloy thereof, but not limited thereto.

As illustrated in FIG. 4, an etching process may be performed on a lower surface 404 of the interposer 400 to form the cavity 410 and the plurality of spacers 412.

The cavity 410 may be formed by selectively removing portions of the first and second lower insulating layers 432a and 432b. The cavity 410 may be formed by performing an etching process on the lower insulating layer 432 on which the second bonding pad 460 and the lower conductive pattern 442 are not formed. The etching process may include a wet etching process, a dry etching process, a plasma etching process, and/or the like.

The wet etching process may be performed using an etchant having an etching selectivity with respect to the lower insulating layer 432. For example, the etchant may include water ($H_2O$), hydrogen peroxide ($H_2O_2$), citric acid ($C_6H_8O_7$), and/or the like. The portions of the lower insulating layer 432 may be removed by the wet etching process.

The dry etching process may include a physical etching process, a chemical etching process, and/or a physical chemical etching process.

For example, the plasma etching process may be performed using inductively coupled plasma, capacitively coupled plasma, microwave plasma, and/or the like.

The cavity 410 may have a bottom surface (BT) and an open upper surface. The cavity 410 may have a first depth D1 from the lower surface 404 of the interposer 400. The first depth D1 of the cavity 410 may be a distance between the bottom surface and the open upper surface (in a vertical direction). The first depth D1 of the cavity 410 may be within a range of 10 μm to 25 μm.

The cavity 410 may include the bottom surface BT and sidewalls extending from the lower surface 404 of the interposer 400 to the bottom surface BT. The bottom surface BT may be a surface exposed from the lower surface 404 of the interposer 400.

The plurality of spacers 412 may be formed to protrude from the bottom surface BT of the cavity 410.

Figure 5:
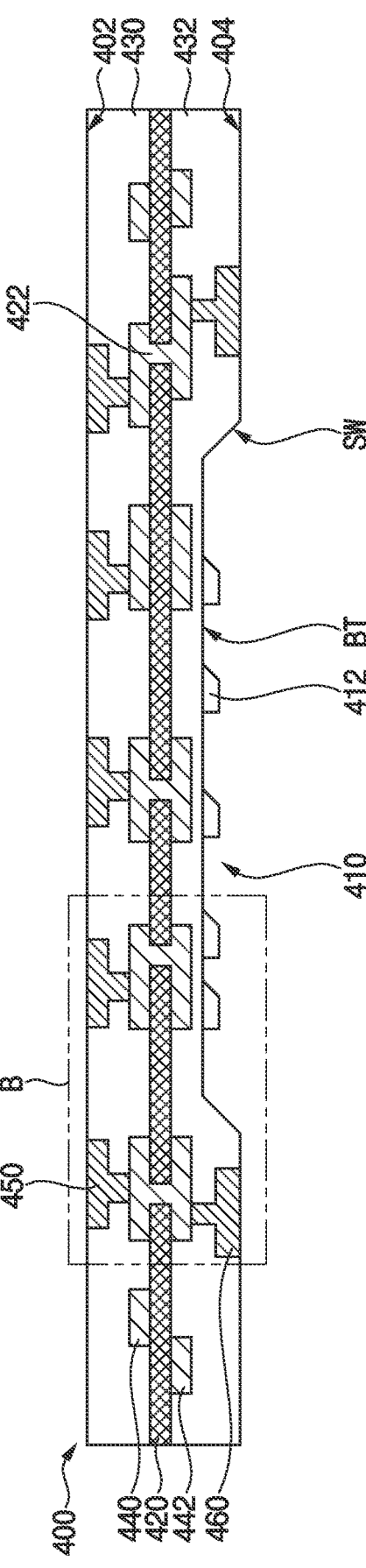

As illustrated in FIGS. 5 and 6, an inclined sidewall SW inclined from a vertical direction may be formed by processing the sidewalls of the cavity 410. An outer portion of the spacer 412 may be processed to have an inclined side surface.

The inclined sidewall SW may be formed by a dry etching process, but not limited thereto. The inclined sidewall SW may be formed by selectively etching the sidewall of the cavity 410. For example, the dry etching process may include a physical etching process, a chemical etching process, and a physical chemical etching process.

The inclined sidewall SW may have a first angle DE1 from the lower surface 404 of the interposer 400. The inclined side surface of the spacer 412 may have a second angle DE2 from the lower surface 404 of the interposer 400.

The inclined sidewall SW of the cavity 410 may have a chamfer shape formed through a chamfering process. For example, the cavity 410 may include a tapered shape. However, the shape of the inclined sidewall SW and the shape of the cavity 410 are not limited thereto.

The inclined sidewall SW of the cavity 410 and the inclined side surface of each of the spacers 412 may be formed to be inclined in a same direction.

As illustrated in FIG. 7, the inclined sidewall SW of the cavity 410 may be formed to have a round surface. The spacer 412 may include more than one inclined side surface. For example, the spacer 412 may be formed to have the inclined side surface on each of both sides opposite to each other.

The inclined sidewall SW of the cavity 410 may have a fillet shape formed through a filleting process. However, the shape of the inclined sidewall SW of the cavity 410 is not limited thereto.

Each of both sides of the spacer 412 may have a second angle DE2 from the lower surface 404 of the interposer 400. For example, the spacer 412 may include a circular cone shape, a quadrangular pyramid shape, a hemisphere shape, a circular truncated cone shape, and a frustum of quadrangular pyramid shape, but not limited thereto.

Figure 8:
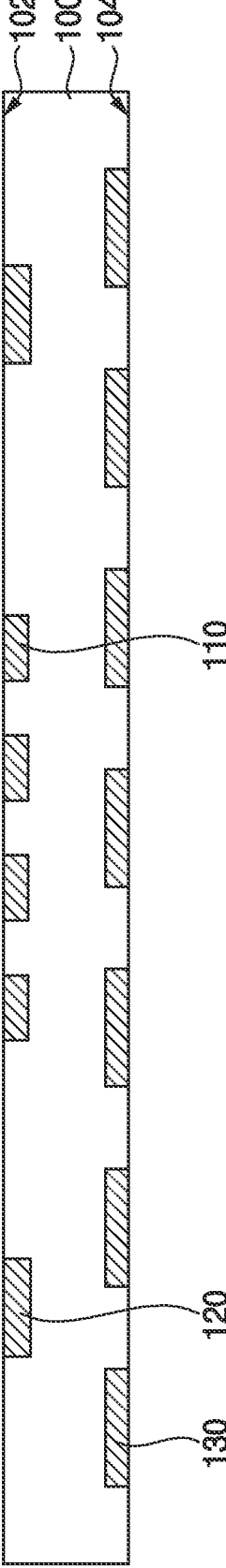
Figure 9:
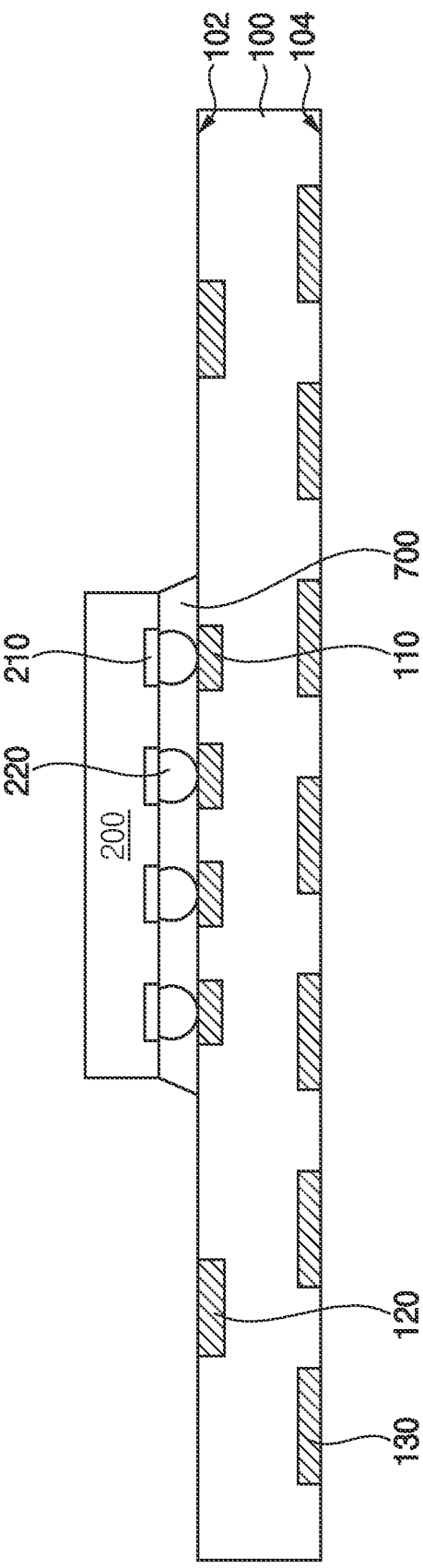
Figure 10:
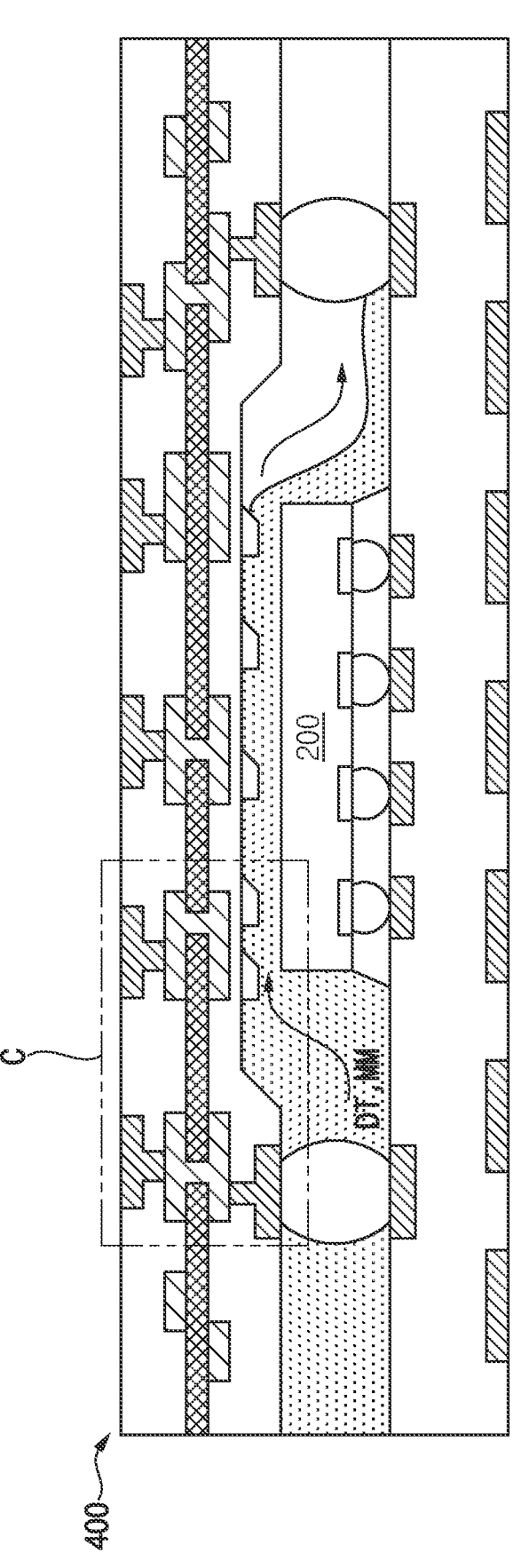

Referring to FIGS. 8 and 9, a first semiconductor device 200 may be mounted on a package substrate 100.

As illustrated in FIG. 8, the package substrate 100 having a plurality of first to third substrate pads 110, 120, 130 may be formed. For example, the package substrate 100 may be a printed circuit board (PCB). The printed circuit board may be a multilayer circuit board having vias and various circuits therein.

As illustrated in FIG. 9, the first semiconductor device 200 may be mounted on the package substrate 100.

The first semiconductor device 200 may be mounted on the package substrate 100 by a flip chip bonding method. The first semiconductor device 200 may be attached on the package substrate 100 by a thermal compression process. The first semiconductor device 200 may be bonded to the first substrate pads 110 via first conductive bumps 220 provided on first chip pads 210. For example, the first conductive bumps 220 may include micro bumps (uBumps).

A first adhesive member 700 may be underfilled between the first semiconductor device 200 and the package substrate 100. The first adhesive member 700 may reinforce a gap between the package substrate 100 and the first semiconductor device 200. For example, the first adhesive member 700 may include an epoxy material to reinforce the gap between the package substrate 100 and the first semiconductor device 200.

Referring to FIGS. 10 to 13, the interposer 400 may be mounted on the package substrate 100. A cleaning process may be performed between the package substrate 100 and the interposer 400, and a molding member 600 may be filled between the package substrate 100 and the interposer 400.

In example embodiments, the package substrate 100 and the interposer 400 may be coupled to each other via conductive structures 300. A first solder bump may be formed on the second substrate pad 120 of the package substrate 100, and a second solder bump may be formed on a second bonding pad 460 of the interposer 400. The first solder bumps of the package substrate 100 and the second solder bumps of the interposer 400 may be coupled to each other through a thermal compression process to form the conductive structures 300. The package substrate 100 and the interposer 400 may be electrically connected to each other by the conductive structures 300.

In example embodiments, the cleaning process may be a process for removing foreign substances between the package substrate 100 and the interposer 400. The cleaning process may be performed by injecting a cleaning agent DT (detergent) into a space between the package substrate 100 and the interposer 400. The foreign substances may be removed from between the package substrate 100 and the interposer 400 by the cleaning agent DT.

As illustrated in FIG. 11, the inclined sidewall SW may not disturb (less disturb) a movement of the cleaning agent DT through the slanted surface from the vertical direction. The inclined sidewall SW may smoothly move the cleaning agent DT through the fillet shape or the chamfer shape. The cleaning agent DT may not remain in the cavity 410 and may not form a void through the slanted surface of the inclined sidewall SW.

The inclined sidewall SW may smoothly move the cleaning agent DT between the interposer 400 and the first semiconductor device 200. Flow of the cleaning agent DT may be controlled through the inclined sidewall SW with the first angle DE1 inclined from the lower surface 404 of the interposer 400. For example, the first angle DE1 may be within a range of 15 degrees to 40 degrees, but not limited thereto.

As illustrated in FIG. 12, the spacer 412 may not disturb (less disturb) the movement of the cleaning agent DT through the inclined side surface. The cleaning agent DT may not remain on the outer portion of the spacer 412 and may not form the void through the inclined side surface.

For example, the spacer 412 may include a circular cone shape, a quadrangular pyramid shape, a hemisphere shape, a circular truncated cone shape, and a frustum of quadrangular pyramid shape, but not limited thereto.

The spacer 412 may smoothly move the cleaning agent DT through the inclined side surface. The flow of the cleaning agent DT may be controlled through the inclined side surface of the spacer 412 with the second angle DE2 inclined from the lower surface 404 of the interposer 400. For example, the second angle DE2 may be within a range of 15 degrees to 40 degrees, but not limited thereto.

An upper surface of the spacer 412 may be spaced apart from an upper surface of the first semiconductor device 200 by a first distance L1. When the first distance L1 is large, the spacer 412 may not disturb (less disturb) the flow of the cleaning agent DT. When the first distance L1 is small, the cleaning agent DT may move between the plurality of spacers 412, and the inclined side surface may prevent (reduce) the cleaning agent DT from being stagnant. For example, the first distance L1 may be within a range of 15 μm to 30 μm, but not limited thereto.

The inclined sidewall SW of the cavity 410 and the inclined side surface of each of the spacers 412 may be inclined in the same direction. When the inclined sidewall SW and the inclined side surface of each of the spacers 412 are inclined in the same direction, the cleaning agent DT may be smoothly moved between the package substrate 100 and the interposer 400 without being disturbed (with less disturbance).

In example embodiments, a molding process may be a process of filling a gap between the package substrate 100 and the interposer 400 with the molding member 600. The molding member 600 may be underfilled between the package substrate 100 and the interposer 400. The molding member 600 may reinforce the gap between the package substrate 100 and the interposer 400.

Figure 13:
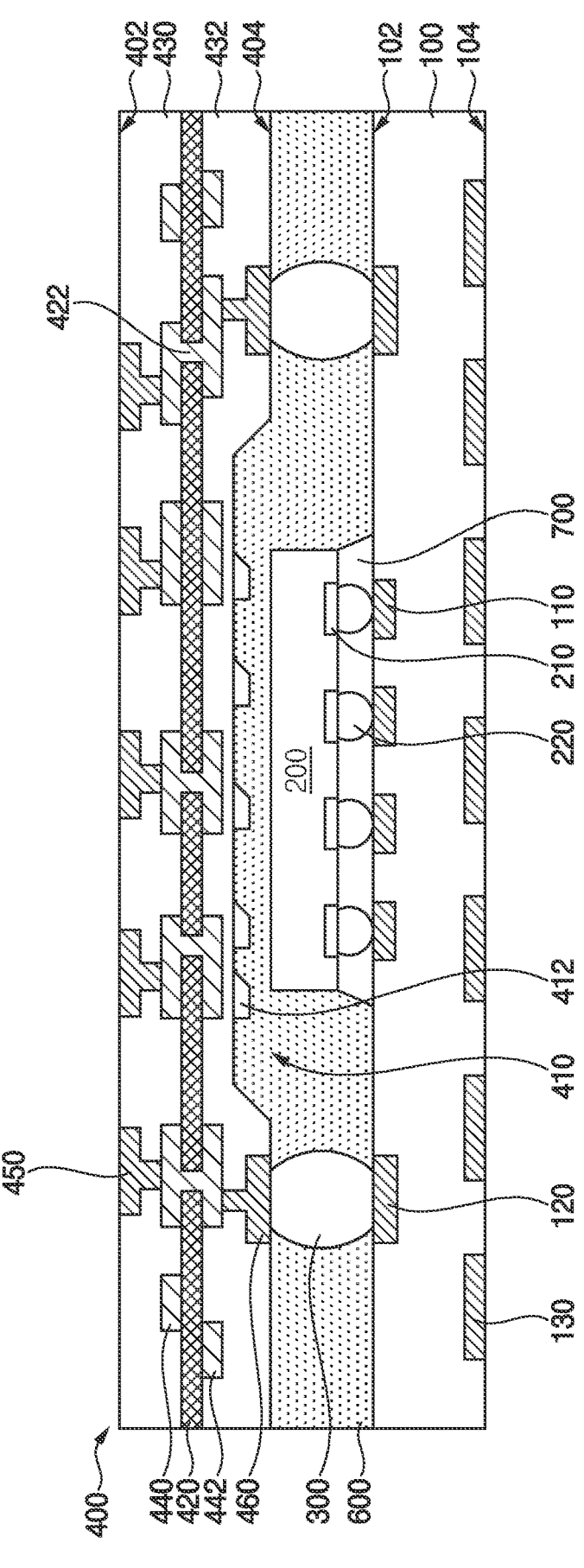

As illustrated in FIG. 13, a molding material MM may fill a space between the interposer 400 and the package substrate 100, and may harden to form the molding member 600. In the molding process, the molding material MM may gradually enter between the package substrate 100 and the interposer 400. The molding material MM may move while filling the space between the interposer 400 and the package substrate 100.

The molding material MM may include an epoxy molding compound (EMC). The molding material MM may include epoxy resin, UV resin, polyurethane resin, silicone resin, or silica filler, but not limited thereto.

As illustrated in FIG. 11, the inclined sidewall SW may not disturb (less disturb) a movement of the molding material MM through the slanted surface from the vertical direction. The inclined sidewall SW may smoothly move the molding material MM through the fillet shape or the chamfer shape.

The inclined sidewall SW may smoothly move the molding material MM between the interposer 400 and the first semiconductor device 200. Flow of the molding material MM may be controlled through the inclined sidewall SW with the first angle DE1 inclined from the lower surface 404 of the interposer 400.

As illustrated in FIG. 12, the spacer 412 may not disturb (less disturb) the movement of the molding material MM through the inclined side surface.

The spacer 412 may smoothly move the molding material MM through the inclined side surface. The spacer 412 may control the flow of the molding material MM through the second angle DE2 inclined from the lower surface 404 of the interposer 400.

The upper surface of the spacer 412 may be spaced apart from the upper surface of the first semiconductor device 200 by the first distance L1. When the first distance L1 is large, the spacer 412 may not disturb (less disturb) the flow of the molding material MM. When the first distance L1 is small, the inclined side surface of the spacer 412 may more smoothly flow the molding material MM.

The inclined sidewall SW of the cavity 410 and the inclined side surface of each of the spacers 412 may be inclined in the same direction. When the inclined sidewall SW and the inclined side surfaces of the spacers 412 are inclined in the same direction, the molding material MM may be smoothly moved between the package substrate 100 and the interposer 400 without being disturbed (with less disturbance).

The cleaning agent DT and the molding material MM may move smoothly between the package substrate 100 and the interposer 400 through the inclined sidewall SW of the cavity 410 and the inclined side surface of the spacer 412. The molding material MM may sufficiently fill the space between the package substrate 100 and the interposer 400, and may not form the void. Fluid may flow along surfaces through the inclined sidewall SW of the cavity 410 and the inclined side surface of the spacer 412, it is possible to prevent a formation of the void because the fluid may not accumulate (less accumulate).

Figure 14:
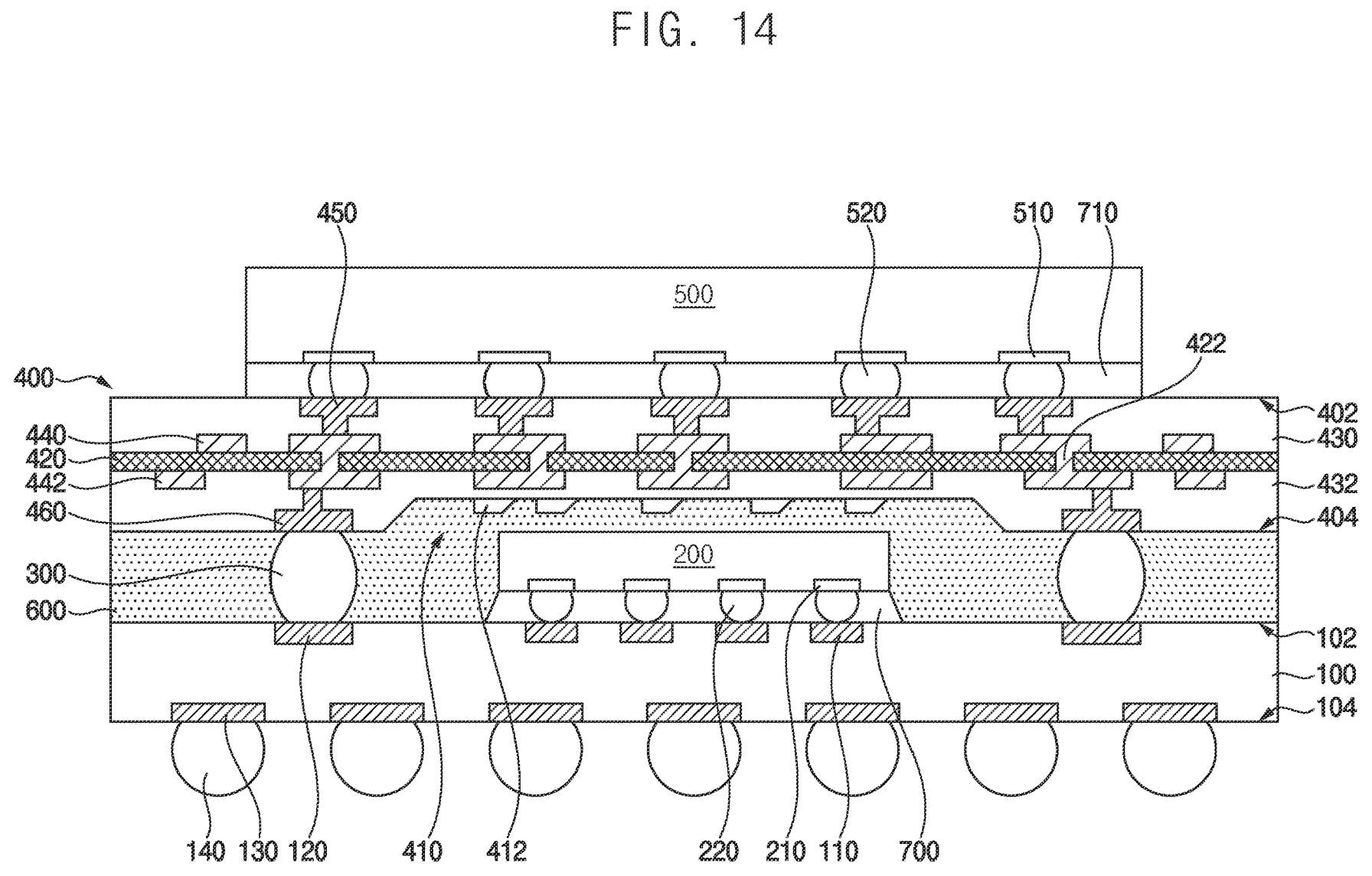

Referring to FIG. 14, after mounting a second semiconductor device 500 on the interposer 400, a second adhesive member 710 that is underfilled between the interposer 400 and the second semiconductor device 500 may be formed.

The second semiconductor device 500 may be mounted on the interposer 400 by a flip chip bonding method. The second semiconductor device 500 may be attached on the interposer 400 by a thermal compression process. The second semiconductor device 500 may be bonded to the first bonding pads 450 via second conductive bumps 520 provided on second chip pads 510. For example, the second conductive bumps 520 may include micro bumps (uBumps).

Then, a second adhesive member 710 may be underfilled between the second semiconductor device 500 and the interposer 400. The second adhesive member 710 may reinforce a gap between the interposer 400 and the second semiconductor device 500.

Then, the semiconductor package 10 of FIG. 1 may be completed by forming external connection bumps 140 such as solder balls on the third substrate pads 130 of the package substrate 100.

Herein, a lower side, a lower portion, a lower surface, and the like, are used to refer to a direction in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an intermediate layer (e.g., adhesive layer) as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing an element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
   a package substrate;
   a first semiconductor device on the package substrate;
   an interposer on the package substrate;
   a plurality of conductive structures that spaces apart the first semiconductor device from the interposer, wherein the interposer has a cavity into which a portion of the first semiconductor device is accommodated; and a spacer that protrudes from a bottom surface of the cavity and is spaced apart from the first semiconductor device, wherein the cavity has an inclined sidewall inclined at a first predetermined angle with respect to a lower surface of the interposer, and the spacer has an inclined side surface inclined at a second predetermined angle with respect to the bottom surface of the cavity.

2. The semiconductor package of claim 1, wherein the cavity has a tapered shape.

3. The semiconductor package of claim 1, wherein the first predetermined angle is within a range of 15 degrees to 40 degrees.

4. The semiconductor package of claim 1, wherein a depth from the lower surface of the interposer to the bottom surface of the cavity in a vertical direction is within a range of 10 micrometers (μm) to 25 μm.

5. The semiconductor package of claim 1, wherein the inclined sidewall of the cavity includes at least one of a fillet shape and a chamfer shape.

6. The semiconductor package of claim 1, wherein the second predetermined angle is within a range of 15 degrees to 40 degrees.

7. The semiconductor package of claim 1, wherein the spacer includes at least one of a circular cone shape, a quadrangular pyramid shape, a hemisphere shape, a circular truncated cone shape, and a frustum of quadrangular pyramid shape.

8. The semiconductor package of claim 1, wherein an upper surface of the spacer is spaced apart from an upper surface of the first semiconductor device by a first distance, and the first distance is within a range of 15 μm to 30 μm.

9. The semiconductor package of claim 1, wherein the inclined sidewall of the cavity inclined at the first predetermined angle and the inclined side surface of the spacer inclined at the second predetermined angle are inclined towards a same direction.

10. The semiconductor package of claim 1, further comprising:

a second semiconductor device on the interposer.

11. A semiconductor package, comprising:

a package substrate;

a semiconductor device on the package substrate;

a plurality of conductive structures on the package substrate, wherein the plurality of conductive structures is in an outer region of the semiconductor device; and an interposer on the plurality of conductive structures, wherein the interposer includes a cavity that has an inclined sidewall inclined at a first predetermined angle with respect to a lower surface of the interposer, wherein the cavity is configured to define a space in which the semiconductor device is accommodated, wherein the interposer includes a plurality of spacer protrusions that protrude from a bottom surface of the cavity, and wherein each of the plurality of spacer protrusions has an inclined side surface inclined at a second predetermined angle with respect to the bottom surface of the cavity.

12. The semiconductor package of claim 11, wherein the cavity has a tapered shape.

13. The semiconductor package of claim 11, wherein the first predetermined angle is within a range of 15 degrees to 40 degrees.

14. The semiconductor package of claim 11, wherein a depth from a lower surface of the interposer to the bottom surface of the cavity in a vertical direction is within a range of 10 micrometers (μm) to 25 μm.

15. The semiconductor package of claim 11, wherein the inclined sidewall of the cavity includes at least one of a fillet shape and a chamfer shape.

16. The semiconductor package of claim 11, wherein the second predetermined angle is within a range of 15 degrees to 40 degrees.

17. The semiconductor package of claim 11, wherein each of the plurality of spacer protrusions includes at least one of a circular cone shape, a quadrangular pyramid shape, a hemisphere shape, a circular truncated cone shape, and a frustum of quadrangular pyramid shape.

18. The semiconductor package of claim 11, wherein an upper surface of each of the plurality of spacer protrusions is spaced apart from an upper surface of the semiconductor device with a first distance, and the first distance is within a range of 15 μm to 30 μm.

19. The semiconductor package of claim 11, wherein the inclined sidewall of the cavity inclined at the first predetermined angle and the inclined side surface of each of the plurality of spacer protrusions inclined at the second predetermined angle are inclined towards a same direction.

20. A method of manufacturing a semiconductor package, comprising:

mounting a semiconductor device on a package substrate;

forming an interposer having a cavity extending from a first surface of the interposer by a predetermined depth;

forming a spacer on a bottom surface of the cavity;

processing a sidewall of the cavity and a side surface of the spacer to have predetermined angles, wherein the side surface of the spacer has an angle within a range of 15 degrees to 40 degrees;

disposing the interposer on the package substrate via a plurality of conductive structures such that a portion of the semiconductor device is accommodated into the cavity; and forming a molding member between the package substrate and the interposer.

* * * * *